(12) United States Patent
Matsutori et al.

(10) Patent No.: US 9,698,033 B2
(45) Date of Patent: Jul. 4, 2017

(54) SUBSTRATE STORING CONTAINER

(71) Applicants: MIRAIAL CO., LTD., Tokyo (JP); Shin-Etsu Polymer Co., Ltd., Tokyo (JP)

(72) Inventors: Chiaki Matsutori, Tokyo (JP); Tsuyoshi Nagashima, Tokyo (JP); Takaharu Oyama, Tokyo (JP); Shuichi Inoue, Tokyo (JP); Hiroyuki Shida, Saitama (JP); Hiroki Yamagishi, Saitama (JP); Kazumasa Ohnuki, Saitama (JP)

(73) Assignees: MIRAIAL CO., LTD., Tokyo (JP); SHIN-ETSU POLYMER CO., LTD., Tokyo (JP)

( * ) Notice: Subject to any disclaimer, the term of this patent is extended or adjusted under 35 U.S.C. 154(b) by 0 days.

(21) Appl. No.: 14/435,093

(22) PCT Filed: Oct. 12, 2012

(86) PCT No.: PCT/JP2012/076439
§ 371 (c)(1),
(2) Date: Apr. 10, 2015

(87) PCT Pub. No.: WO2014/057572
PCT Pub. Date: Apr. 17, 2014

(65) Prior Publication Data
US 2015/0279711 A1 Oct. 1, 2015

(51) Int. Cl.
*B65D 43/02* (2006.01)
*H01L 21/673* (2006.01)

(52) U.S. Cl.
CPC .... *H01L 21/67376* (2013.01); *H01L 21/6732* (2013.01); *H01L 21/67369* (2013.01); *H01L 21/67383* (2013.01)

(58) Field of Classification Search
CPC .......... H01L 21/67303; H01L 21/6732; H01L 21/6735; H01L 21/67383; Y10S 206/832
(Continued)

(56) References Cited

U.S. PATENT DOCUMENTS 7,413,099 B2 * 8/2008 Takahashi .............. B65D 53/02
206/710
7,909,167 B2 3/2011 Chiu et al.
(Continued)

FOREIGN PATENT DOCUMENTS

JP 2000-159288 6/2000
JP 2002-353301 12/2002
(Continued)

*Primary Examiner* — Anthony Stashick
*Assistant Examiner* — Mollie Impink
(74) *Attorney, Agent, or Firm* — Muncy, Geissler, Olds & Lowe, P.C.

(57) ABSTRACT

A substrate storing container is provided with a lid-body-side substrate support section that can support the edges of a plurality of substrates when a container main body opening is occluded by the lid body. The lid-body-side substrate support section is provided with: a lid-body-side substrate receiving section and a pair of lid-body-side leg sections respectively connected to one end and the other end of the lid-body-side substrate receiving section. One lid-body-side leg section of the pair of lid-body-side leg sections is fixed at the outside of a concavity for fixing a lid-body leg section, and the other lid-body-side leg section of the pair of lid-body-side leg sections is fixed within the concavity for fixing a lid-body leg section.

6 Claims, 11 Drawing Sheets

(58) Field of Classification Search
USPC .......................................... 206/862; 414/938
See application file for complete search history.

(56) References Cited

U.S. PATENT DOCUMENTS

| | | | |
|---|---|---|---|
| 8,910,792 B2* | 12/2014 | Nagashima | H01L 21/67369 206/454 |
| 2003/0221985 A1 | 12/2003 | Yajima et al. | |
| 2005/0218034 A1 | 10/2005 | Kawashima | |
| 2006/0213796 A1 | 9/2006 | Kominami | |
| 2010/0282638 A1 | 11/2010 | Chiu et al. | |

FOREIGN PATENT DOCUMENTS

| | | |
|---|---|---|
| JP | 2005-294386 | 10/2005 |
| JP | 2006-269771 | 10/2006 |
| JP | 2008-034879 | 2/2008 |
| JP | 2010-263185 | 11/2010 |
| JP | 2012-004380 | 1/2012 |
| TW | 201040091 A | 11/2010 |
| WO | WO2011148450 A1 * | 12/2011 |

* cited by examiner

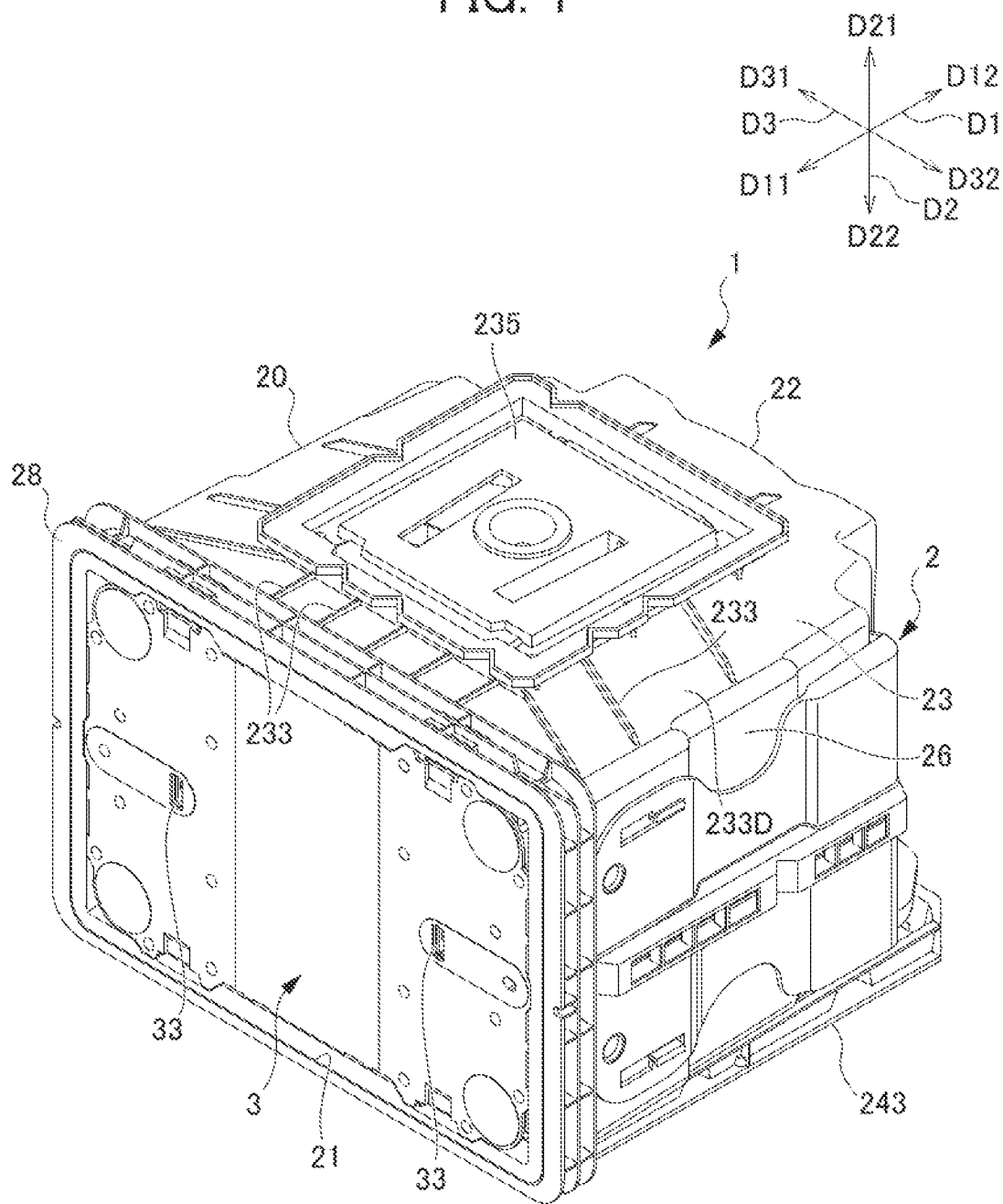

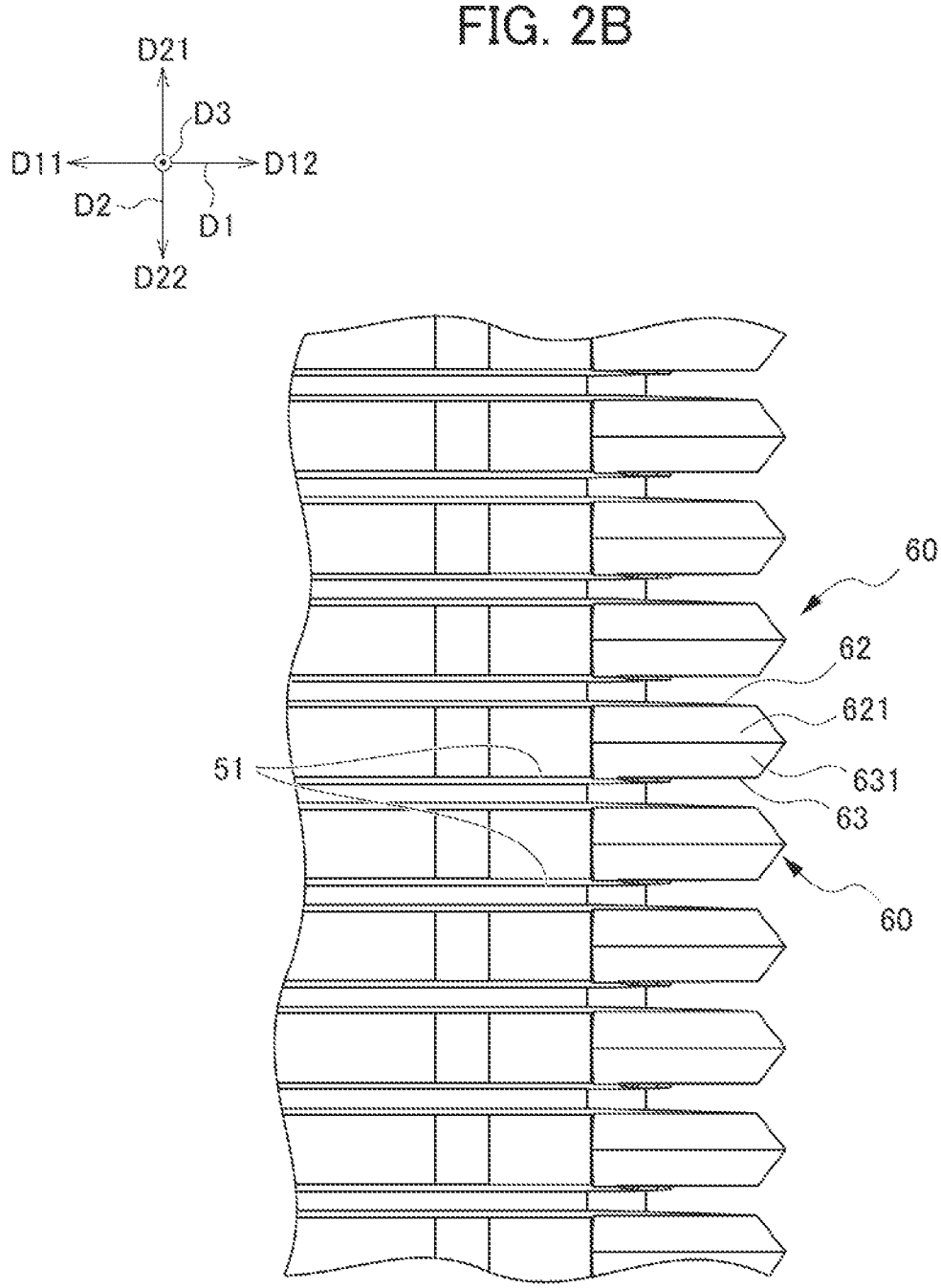

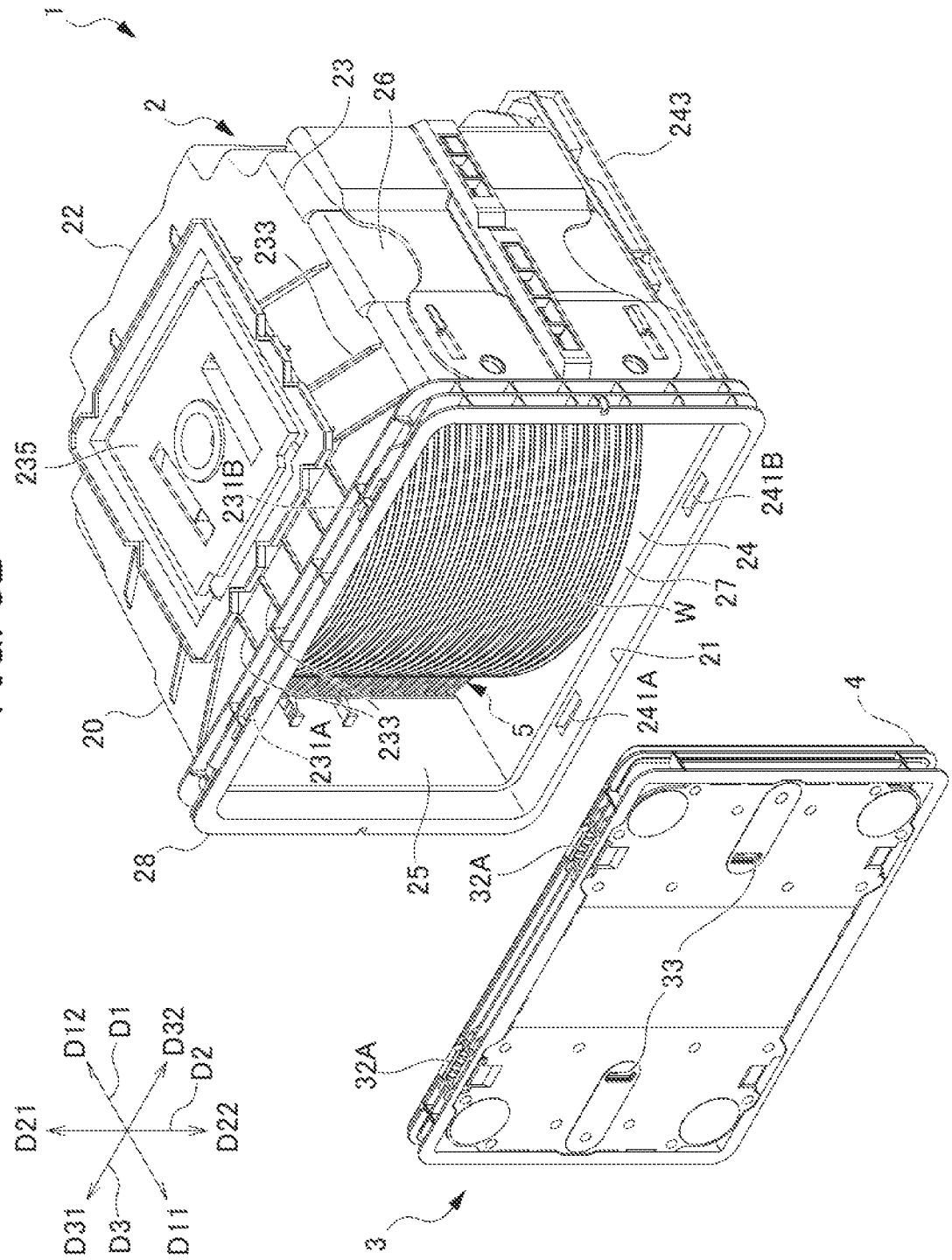

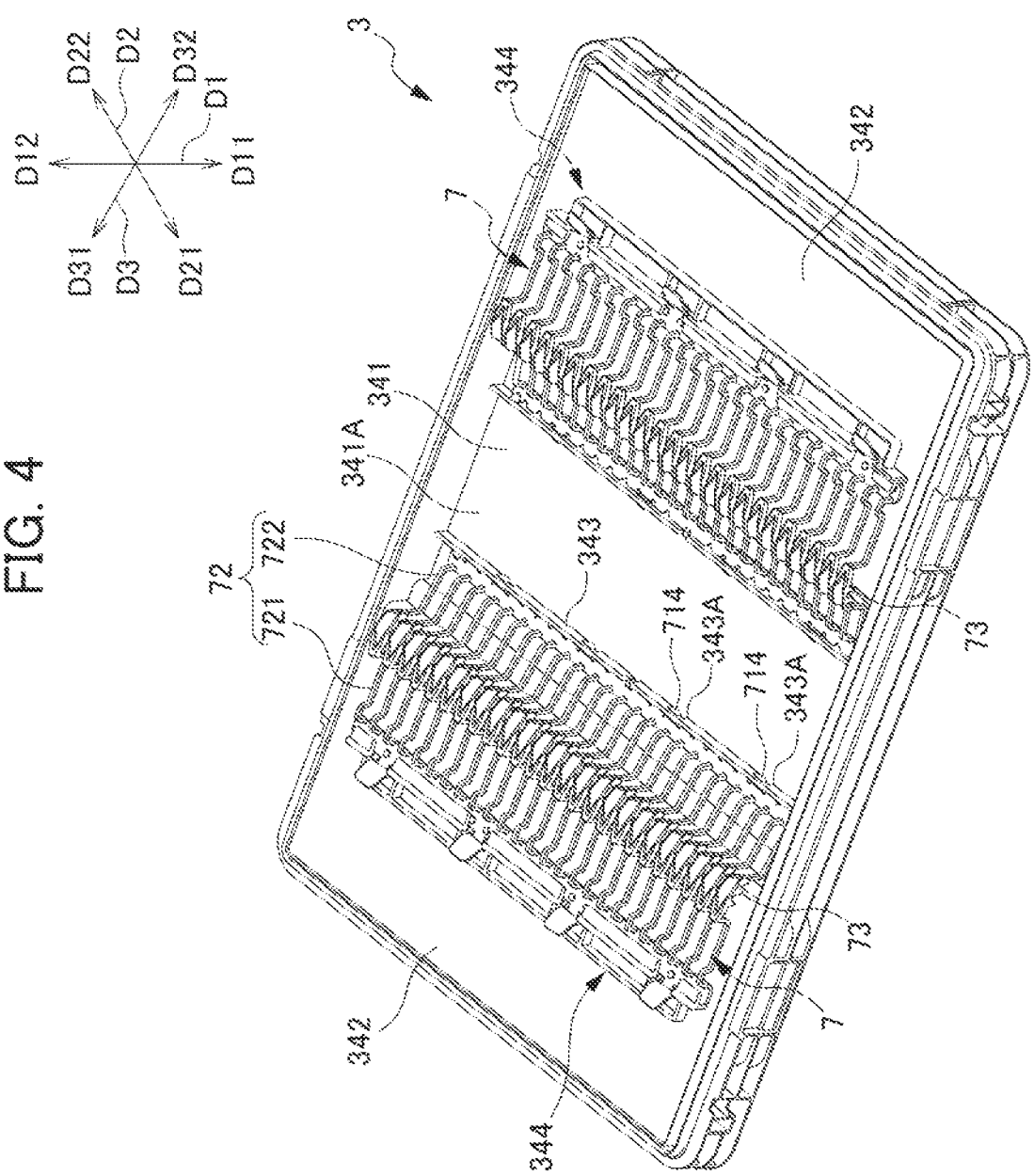

SUBSTRATE STORING CONTAINER

TECHNICAL FIELD

The present invention relates to a substrate storing container. More specifically, the present invention relates to a substrate storing container that stores a plurality of substrates such as semiconductor wafers, etc., in a state arranged in parallel.

BACKGROUND ART

As a container that stores substrates such as a semiconductor wafers, etc., one has been known conventionally that has a configuration including a container main body, a lid body, a sealing member, a substrate support plate-like portion, a front retainer, and a back-side substrate support portion.

The container main body has a tubular wall portion in which a container main body opening portion is formed at one end, and in which the other end is closed. A substrate storing space is formed in the container main body. The substrate storing space is formed by being surrounded by the wall portion and can store a plurality of substrates.

The lid body has a sealing member installation portion. The sealing member is fixed in the sealing member installation portion. Furthermore, a concave portion for fixing a lid body leg portion is formed in inner face of the lid body at a portion that closes the container main body opening portion. The lid body can be removably attached to the container main body opening portion and can close the container main body opening portion.

Substrate support plate-like portions are provided at the wall portion so as to form a pair in the substrate storing space. When the container main body opening portion is not closed by the lid body, the substrate support plate-like portions can support edge portions of a plurality of substrates in a state in which adjacent substrates are arranged in parallel to be spaced by a predetermined interval.

The front retainer is provided in the concave portion for fixing the lid body leg portion of the lid body. The front retainer has a front retainer leg portion and a front retainer substrate receiving portion. The front retainer substrate receiving portion is supported by the front retainer leg portion. The front retainer leg portion is fixed to a part of the lid body at a portion forming the concave portion for fixing the lid body leg portion. When the container main body opening portion is closed by the lid body, the front retainer can support edge portions of the plurality of substrates.

The back-side substrate support portion is integrally formed with the substrate support plate-like portion so as to form a pair with the front retainer. The back-side substrate support portion can support edge portions of a plurality of substrates. When the container main body opening portion is closed by the lid body, the back-side substrate support portion retains a plurality of substrates in a state in which adjacent substrates are arranged in parallel to be spaced apart by a predetermined interval by supporting the plurality of substrates in cooperation with the front retainer (refer to Japanese Unexamined Patent Application, Publication No. 2000-159288).

It should be noted that the back-side substrate support portion may be formed integrally formed with a lateral substrate support portion, or may be configured so as to be separate from the lateral substrate support portion.

Patent Document 1: Japanese Unexamined Patent Application, Publication No. 2000-159288

DISCLOSURE OF THE INVENTION

Problems to be Solved by the Invention

As mentioned above, in the substrate storing container, the front retainer supports a substrate in cooperation with the back-side substrate support portion. The substrate storing container is transported in this state. For this reason, it is required to suppress as much as possible impacts received from the outside of the substrate storing container from being transmitted to the substrates via the front retainer and the back-side substrate support portion, by the front retainer possessing favorable elasticity.

It is an object of the present invention to provide a substrate storing container having a front retainer that has favorable elasticity and can support substrates.

Means for Solving the Problems

The present invention relates to a substrate storing container including: a container main body having a substrate storing space that can store a plurality of substrates formed inside thereof, and having an opening circumferential portion at which a container main body opening portion that is in communication with the substrate storing space is formed at one end portion thereof; a lid body that is removably attached to the opening circumferential portion and can close the container main body opening portion; a lid body side substrate support portion which is arranged at a portion of the lid body that is a part opposing the substrate storing space when the container main body opening portion is closed by the lid body, and can support edge portions of the plurality of substrates when the container main body opening portion is closed by the lid body; and a back-side substrate support portion that is arranged so as to form a pair with the lid body side substrate support portion inside the substrate storing space, that can support the edge portions of the plurality of substrates, and that supports the plurality of substrates in cooperation with the lid body side substrate support portion when the container main body opening portion is closed by the lid body, in which the lid body side substrate support portion includes a lid body side substrate receiving portion and a pair of lid body side leg portions respectively connected to one end portion and another end portion of the lid body side substrate receiving portion, a lid-body-leg portion fixing concave portion that is concave in a direction opposite to a depth direction is formed at a part of an inner face of the lid body that is a portion which closes the container main body opening portion, and one lid body side leg portion among the pair of lid body side leg portions is fixed outside the lid-body-leg portion fixing concave portion and the other lid body side leg portion of the pair of lid body side leg portions is fixed inside the lid-body-leg portion fixing concave portion.

Furthermore, it is preferable that the lid body side substrate receiving portion can swing with a part of the one lid body side leg portion that is a portion fixed to the lid body as an axial center for swinging.

Moreover, it is preferable that the lid body side substrate receiving portion is not arranged inside the lid-body-leg portion fixing concave portion, and is arranged more toward a back side than the lid-body-leg portion fixing concave portion in the depth direction.

Furthermore, it is preferable that the lid body has a sealing member installation portion, the substrate storing container further includes a sealing member that is installed into the sealing member fitting portion, that can abut with the opening circumferential portion, and that closes the container main body opening portion by the lid body in an air tight state, by being interposed between the opening circumferential portion and the lid body so as to tightly abut with the opening circumferential portion, and the one lid body side leg portion is fixed to a part of the lid body that is a portion more toward a back side than the sealing member installation portion in a depth direction which is a direction from one end portion of the container main body to the other end portion with respect to the one end portion, and the other lid body side leg portion is fixed to a part of the lid body that is a portion more toward a forward direction than the sealing member installation portion in the depth direction.

Moreover, it is preferable that the lid body side substrate receiving portion is arranged so as to form a pair in a direction orthogonal to a direction connecting one end portion and the other end portion of the container main body, and a lid body side leg portion connected to one lid body side substrate receiving portion among the lid body side substrate receiving portions forming a pair and a lid body side leg portion connected to another lid body side substrate receiving portion among the lid body side substrate receiving portions forming the pair are configured separately.

Effects of the Invention

According to the present invention, it is possible to provide a substrate storing container having a front retainer that has favorable elasticity and can support substrates.

BRIEF DESCRIPTION OF THE DRAWINGS

FIG. 1 is a perspective view illustrating a substrate storing container according to the present embodiment;

FIG. 2B is an enlarged cross-sectional side view illustrating a back-side substrate support portion of a substrate storing container according to the present embodiment;

FIG. 3B is an exploded perspective view illustrating a state in which substrates are stored in a substrate storing space of a container main body of a substrate storing container according to the present embodiment;

FIG. 4 is a perspective view from behind illustrating a lid body of a substrate storing container according to the present embodiment;

PREFERRED MODE FOR CARRYING OUT THE INVENTION

Figure 2A:
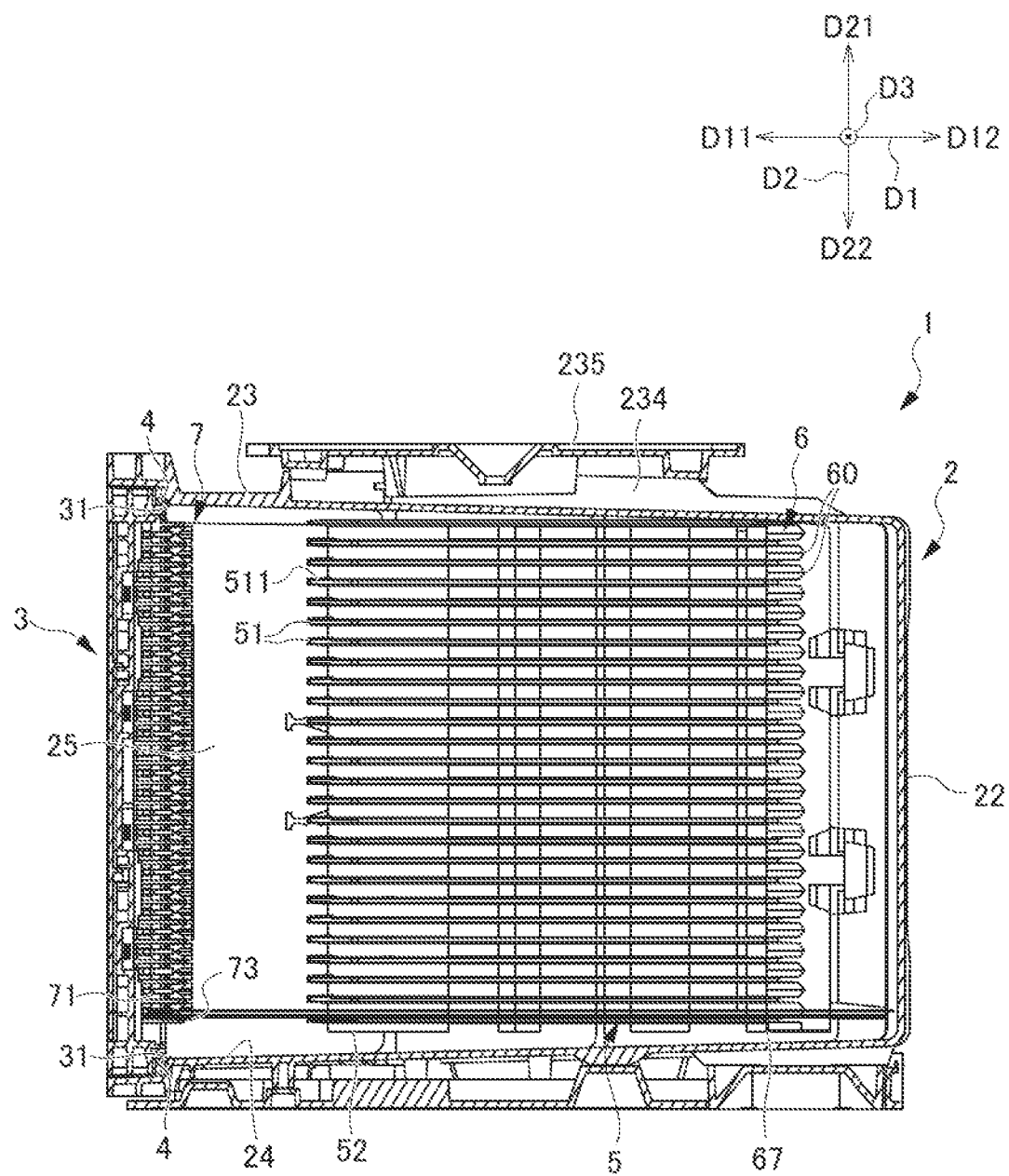
FIG. 2A is a cross-sectional view illustrating a substrate storing container according to the present embodiment.
Figure 3A:
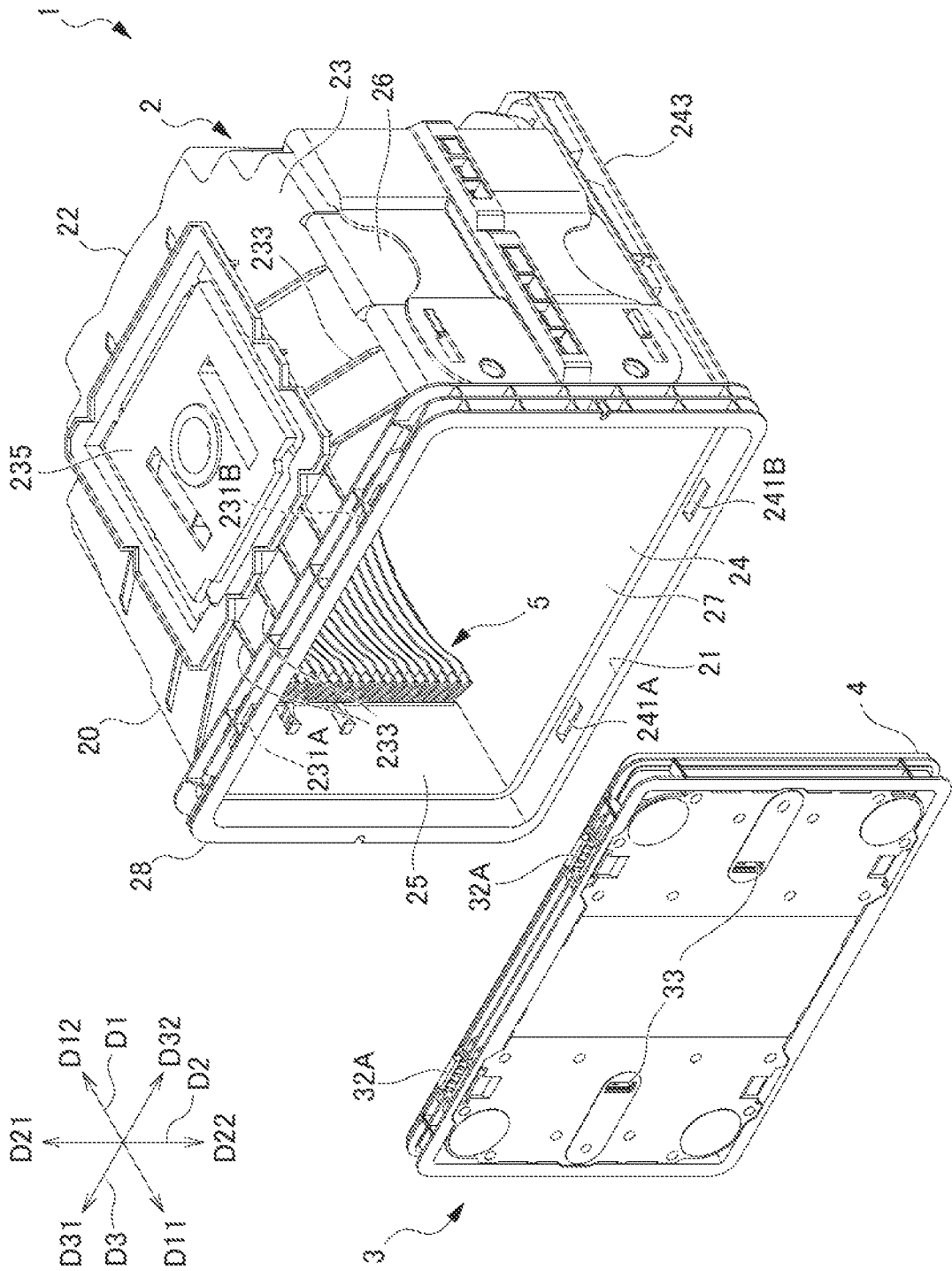
FIG. 3A is an exploded perspective view illustrating a state in which a lid of a substrate storing container according to the present embodiment is open.
Figure 5:
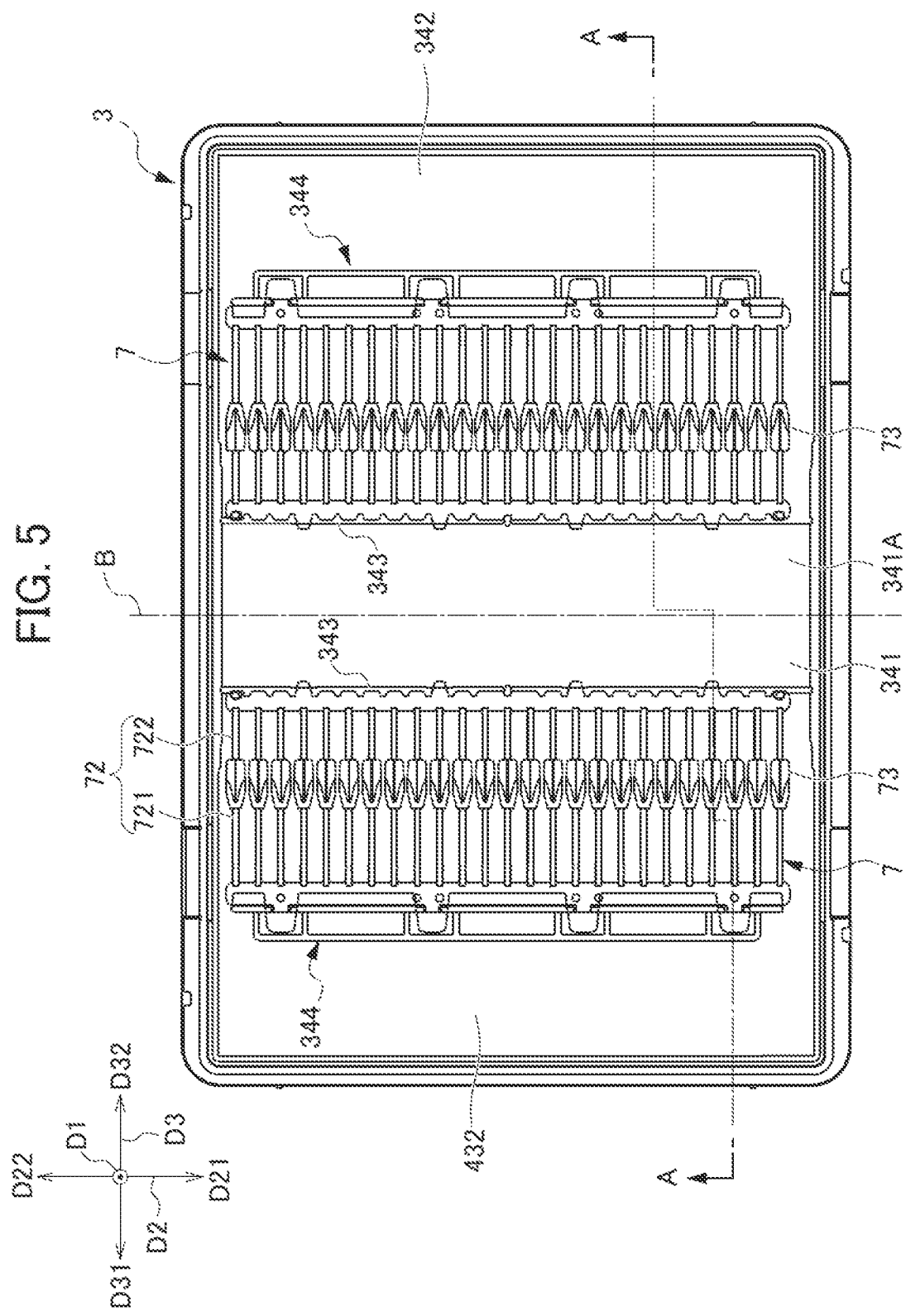
FIG. 5 is a rear view illustrating a lid body of a substrate storing container according to the present embodiment.
Figure 6:
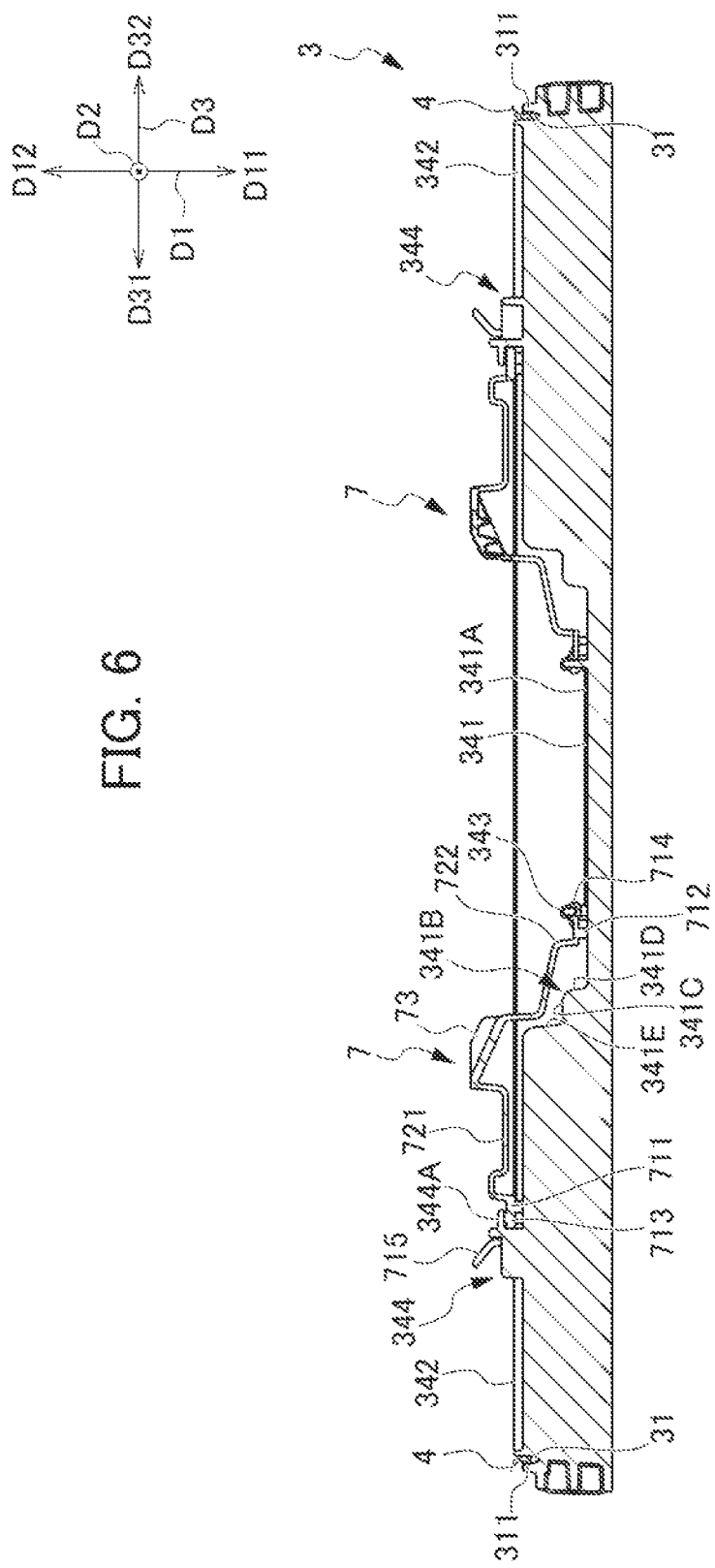
FIG. 6 is a cross-sectional view along the line A-A shown in FIG. 5.
Figure 7:
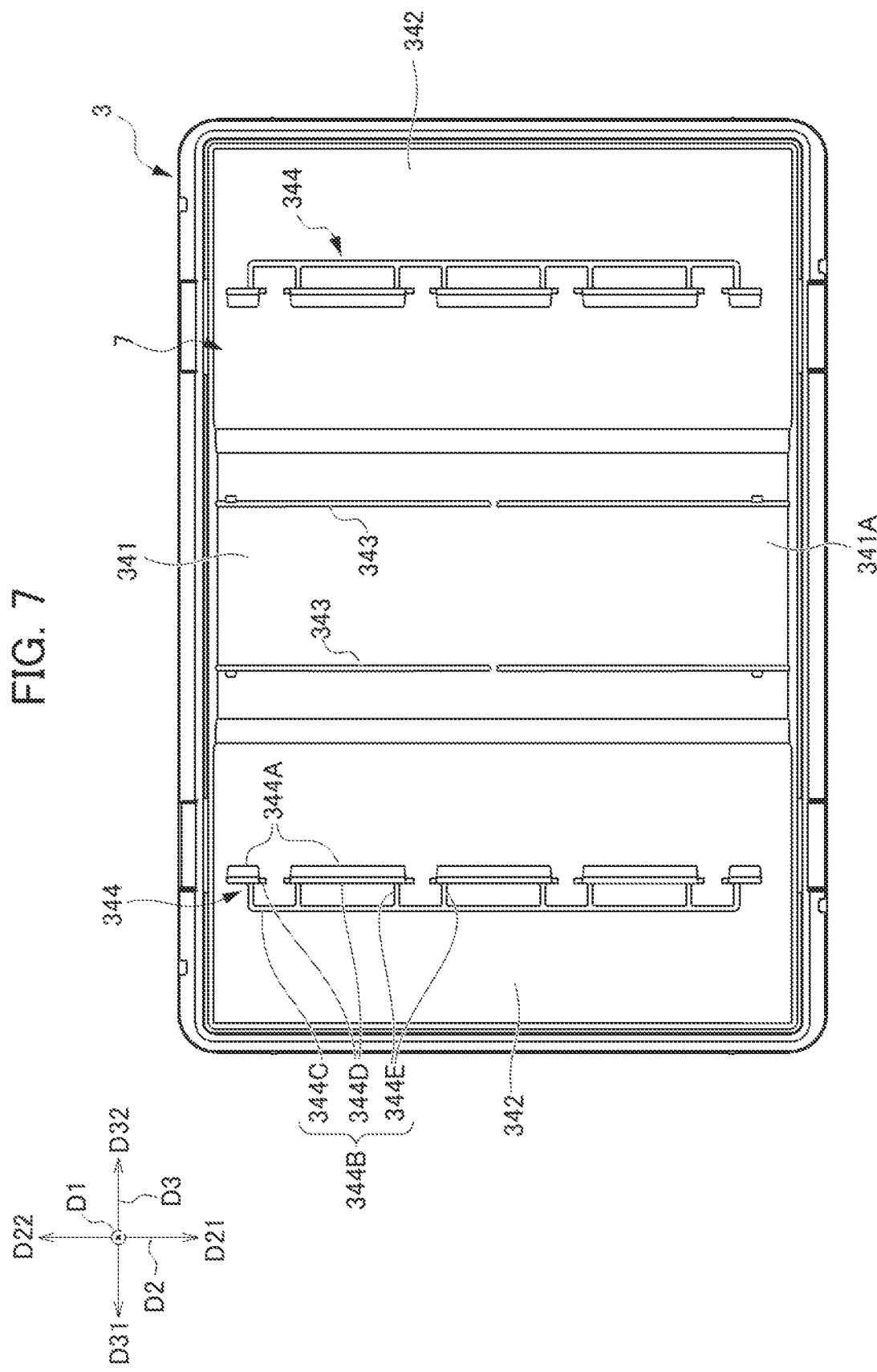
FIG. 7 is a rear view illustrating a lid body of a substrate storing container according to the present embodiment, the rear view showing a state in which a front retainer is removed.
Figure 8A:
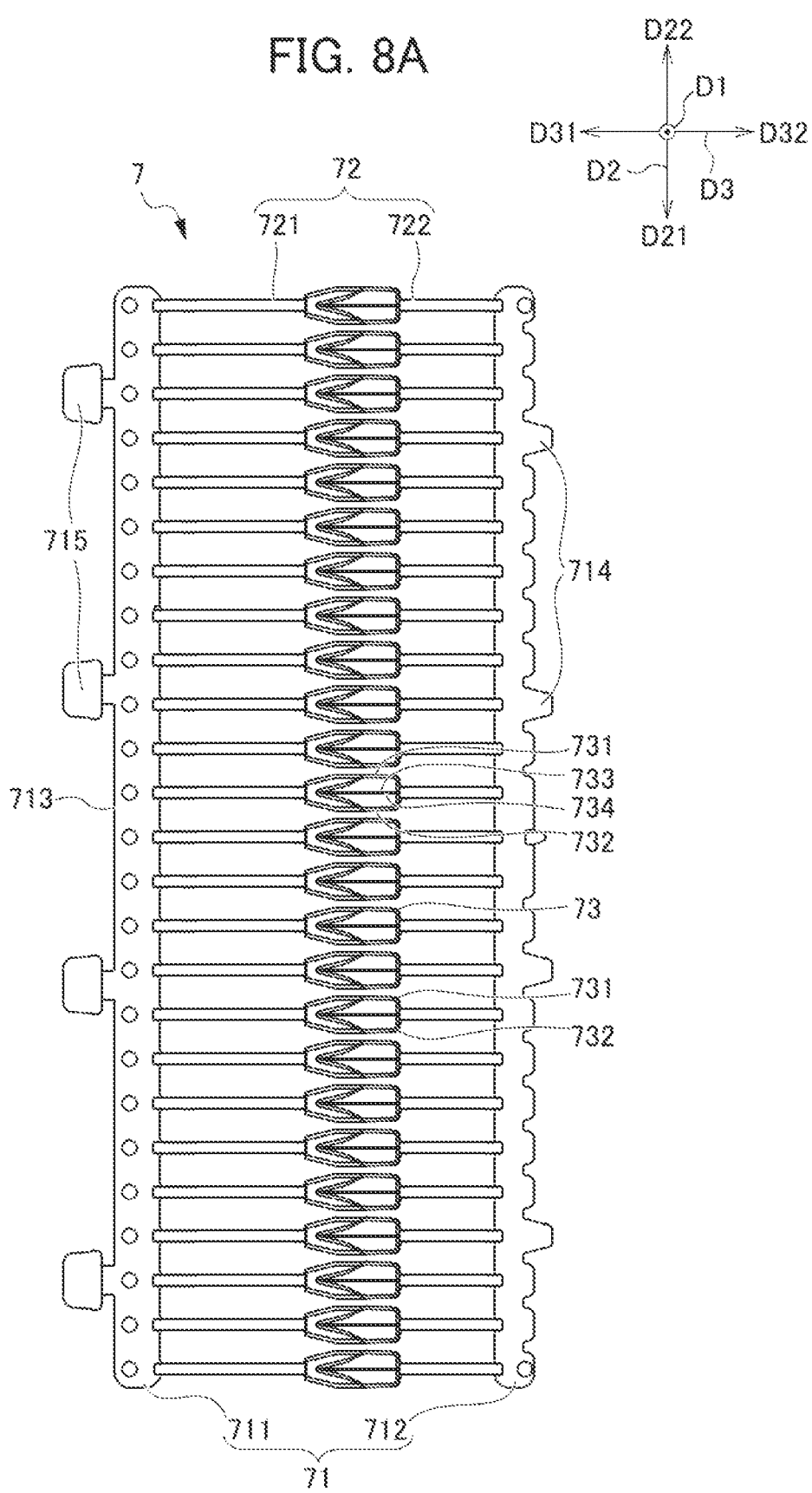
FIG. 8A is a rear view illustrating a front retainer of a substrate storing container according to the present embodiment.
Figure 8B:
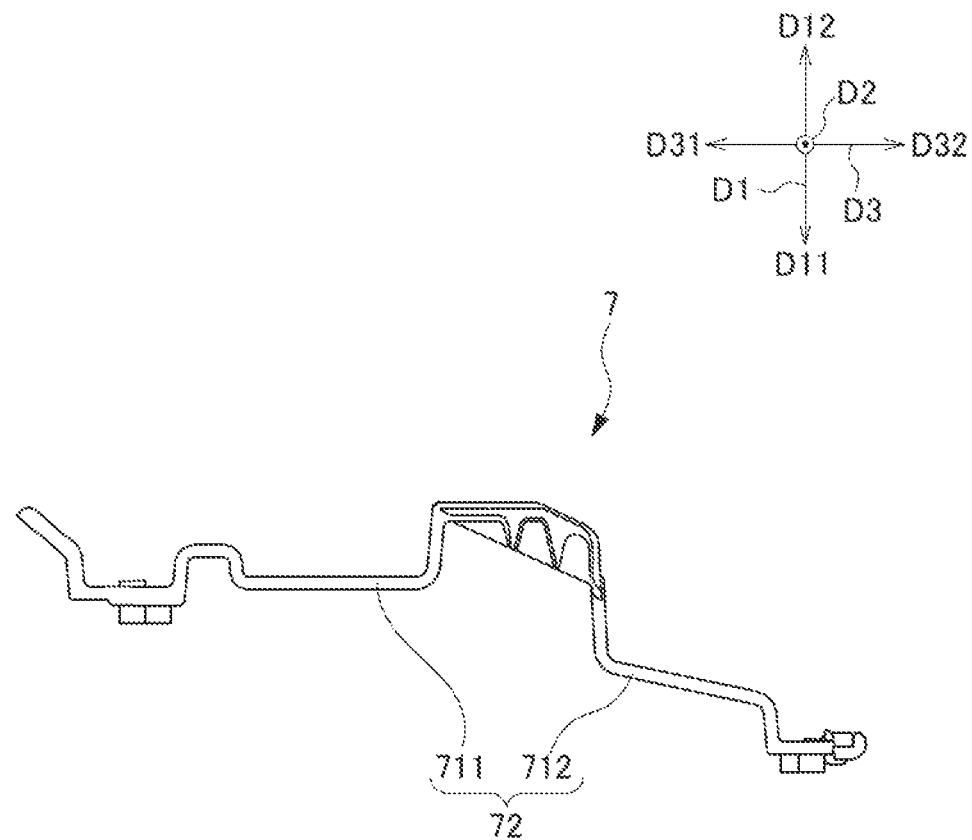
FIG. 8B is a plan view illustrating a front retainer of a substrate storing container according to the present embodiment.

In the follow, a substrate storing container according to an embodiment of the present invention is described with reference to the drawings. FIG. 1 is a perspective view illustrating a substrate storing container according to the present embodiment. FIG. 2A is a cross-sectional view illustrating the substrate storing container according to the present embodiment. FIG. 2B is an enlarged cross-sectional side view illustrating a back-side substrate support portion of the substrate storing container according to the present embodiment. FIG. 3A is an exploded perspective view illustrating a state in which a lid of the substrate storing container according to the present embodiment is open. FIG. 3B is an exploded perspective view illustrating a state in which substrates are stored in a substrate storing space of a container main body of the substrate storing container according to the present embodiment. FIG. 4 is a perspective view from behind illustrating a lid body of the substrate storing container according to the present embodiment. FIG. 5 is a rear view illustrating a lid body of the substrate storing container according to the present embodiment. FIG. 6 is a cross-sectional view along the line A-A shown in FIG. 5. FIG. 7 is a rear view illustrating the lid body of the substrate storing container according to the present embodiment, the rear view showing a state in which a front retainer is removed. FIG. 8A is a rear view illustrating the front retainer of the substrate storing container according to the present embodiment. FIG. 8B is a plan view illustrating the front retainer of the substrate storing container according to the present embodiment.

Herein, for the purpose of illustration, the direction from a container main body 2 toward a lid body 3 (described later) (direction from the upper right toward the lower left in FIG. 1) is defined as a forward direction D11 and the direction opposite to the direction D11 is defined as a backward direction D12. Furthermore, these directions are defined as a forward/backward direction D1. In addition, the direction from a lower wall 24 to an upper wall 23 (described later) (upper direction in FIG. 1) is defined as an upper direction D21 and the direction opposite to the direction D21 is defined as a lower direction D22. Furthermore, these directions are defined as an upper/lower direction D2. Moreover, the direction from a second side wall 26 to a first side wall 25 (described later) (direction from the lower right to the upper left in FIG. 1) is defined as a left direction D31 and the direction opposite to the direction D31 is defined as a right direction D32. Furthermore, these directions are defined as a left/right direction D3.

Furthermore, a substrate W (refer to FIG. 3B, etc.) stored in a substrate storing container 1 is a disk-like silicon wafer, glass wafer, sapphire wafer, etc., and is a thin member used for industrial use. The substrate W in the present embodiment is a silicon wafer having a diameter of 450 mm.

As illustrated in FIGS. 1 to 3B, the substrate storing container 1 includes a container main body 2, a lid body 3, a sealing member 4, a substrate support plate-like portion 5, and a front retainer 7.

As illustrated in FIG. 3A, the container main body 2 has a tubular wall portion 20 with a container main body opening portion 21 formed at one end portion and the other end portion closed. A substrate storing space 27 is formed in the container main body 2. The substrate storing space 27 is formed to be surrounded by the wall portion 20. The substrate support plate-like portion 5 is disposed at a part of the wall portion 20 that is a portion forming the substrate storing space 27. As illustrated in FIG. 3B, a plurality of substrates W can be stored in the substrate storing space 27.

The substrate support plate-like portion 5 is provided at the wall portion 20 so as to form a pair in the substrate storing space 27. When the container main body opening portion 21 is not closed by the lid body 3, the substrate support plate-like portion 5 can support the edge portions of the plurality of substrates W in a state in which adjacent substrates W are arranged in parallel to be spaced apart by a predetermined interval. A back-side substrate support portion 6 is provided at a back side of the substrate support plate-like portion 5. When the container main body opening portion 21 is closed by the lid body 3, the back-side substrate support portion 6 can support rear portions of the edge portions of the plurality of substrates W.

The lid body 3 can be removably attached to the container main body opening portion 21 and can close the container main body opening portion 21. The front retainer 7 is a part of the lid body 3 and provided at a portion which faces the substrate storing space 27 when the container main body opening portion 21 is closed by the lid body 3. The front retainer 7 is provided so as to form a pair with the back-side substrate support portion 6.

When the container main body opening portion 21 is closed by the lid body 3, the front retainer 7 can support front portions of the edge portions of the plurality of substrates W. When the container main body opening portion 21 is closed by the lid body 3, the front retainer 7 retains the plurality of substrates W in a state in which adjacent substrates W are arranged in parallel to be spaced apart by a predetermined interval by supporting the plurality of substrates W in cooperation with the back-side substrate support portion 6. Each portion is described in detail in the following.

As illustrated in FIG. 3A, etc., the wall portion 20 of the container main body 2 includes a back wall 22, an upper wall 23, a lower wall 24, a first side wall 25, and a second side wall 26. The back wall 22, the upper wall 23, the lower wall 24, the first side wall 25, and the second side wall 26 are made of a plastic material, etc., and are configured so as to be integrally molded with polycarbonate in the first embodiment.

The first side wall 25 faces the second side wall 26 and the upper wall 23 faces the lower wall 24. A rear edge of the upper wall 23, a rear edge of the lower wall 24, a rear edge of the first side wall 25, and a rear edge of the second side wall 26 are all connected to the back wall 22. A front edge of the upper wall 23, a front edge of the lower wall 24, a front edge of the first side wall 25, and a front edge of the second side wall 26 have a positional relationship opposite the back wall 22, and configure an opening circumferential portion 28 which forms the container main body opening 21 in a substantially rectangular shape.

The opening circumferential portion 28 is provided at one edge portion of the container main body 2, and the back wall 22 is located at the other edge portion of the container main body 2. The profile of the container main body 2 formed by the outer faces of the wall portion 20 is a box shape. Inner faces of the wall portion 20, i.e. an inner face of the back wall 22, an inner face of the upper wall 23, an inner face of the lower wall 24, an inner face of the first side wall 25, and an inner face of the second side wall 26, form the substrate storing space 27, which is surrounded thereby. The container main body opening portion 21 formed by the opening circumferential portion 28 is surrounded by the wall portion 20 and is in communication with the substrate storing space 27 formed inside the container main body 2. As described later, the substrate storing space 27 can store a maximum of 25 substrates W.

As illustrated in FIG. 3A, latch engagement concave portions 231A, 231B, 241A, and 241B, which are concave outwardly from the substrate storing space 27, are formed at portions of the upper wall 23 and the lower wall 24 which are proximal to the opening circumferential portion 28. Each of the latch engagement concave portions 231A, 231B, 241A, and 241B is respectively formed in the vicinities of both right and left edge portions of the upper wall 23 and the lower wall 24. The total amount thereof is four.

As illustrated in FIG. 1, FIG. 2A, and FIG. 3A, ribs 233 and a flange fixing portion 234 are provided so as to be integrally formed with the upper wall 23 at an outer face of the upper wall 23. A plurality of the ribs 233 is provided which projects toward the upper direction D21 from the outer face of the upper wall 23. The ribs 233 include ribs extending in substantially the forward/backward direction D1 and ribs extending in substantially the left/right direction D3. A top flange 235 is fixed at the flange fixing portion 234. The top flange 235 is fixed at the upper wall 23 and becomes a member corresponding to a portion of the substrate storing container 1 from which it is hung to be suspended when suspending the substrate storing container 1 by AMHS (Automated Material Handling System), PGV (Person Guided Vehicle), etc.

As illustrated in FIGS. 3A and 3B, container main body leg portions 243 are provided at outer faces of the lower wall 24. The container main body leg portions 243 are attached at both left and right end edges of the lower wall 24 and extend in the forward/backward direction D1 along the left and right end edges of the lower wall 24. When the container main body 2 is placed on a horizontal flat face with the lower wall 24 as a lower side (side in the lower direction D22), the container main body leg portions 243 touch the flat face to stably support the container main body 2.

As illustrated in FIGS. 2A and 3A, the substrate support plate-like portions 5 are provided at the first side wall 25 and the second side wall 26, respectively, and are arranged in the substrate storing space 27 so as to form a pair in the left/right direction D3. More specifically, as illustrated in FIG. 2A, the substrate support plate-like portion 5 includes a plate portion 51 and a plate portion support portion 52. The plate portion 51 and the plate portion support portion 52 are configured to be integrally formed by resin. The plate portion 51 has a plate-like arc shape. Twenty-five of the plate portions 51 are provided at the first side wall 25 and the second side wall 26, respectively. The total number of the plate portions 51 is 50. The adjacent plate portions 51 are arranged so as to be spaced apart in the upper/lower direction D2 by an interval of 10 mm to 12 mm in a parallel positional relationship. It should be noted that a member of the same shape as the plate portion 51 is arranged above the plate 51 located at the top. This is a member that serves as a guide upon inserting for the substrate W to be inserted into the substrate storing space 27 to be located at the top.

Furthermore, the twenty-five plate portions 51 provided at the first side wall 25 and the twenty-five plate portions 51 provided at the second side wall 26 have a positional relationship opposite each other in the left/right direction D3. Furthermore, the fifty plate portions 51 and two members that serve as guides having substantially the same shape as the plate portion 51 have a positional relationship parallel to an inner face of the lower wall 24. As illustrated in FIG. 2A, a convex portion 511 is provided at an upper face of the plate portion 51. The substrate W supported by the plate portion 51 is only in contact with a projecting edge of the convex portion 511, and does not contact with the face of the plate portion 51.

As illustrated in FIG. 2A, the plate portion support portion 52 is configured with a member extending in the upper/lower direction D2. The twenty-five plate portions 51 provided at the first side wall 25 are connected to the plate portion support portion 52 provided at the first side wall 25 side. Similarly, the twenty-five plate portions 51 provided at the second side wall 26 are connected to the plate portion support portion 52 provided at the second side wall 26 side.

The plate portion support portion 52 includes first side wall engagement portions (not illustrated). The first side wall locking portions can be locked with lateral plate locking portions (not illustrated) provided respectively at the first side wall 25 and the second side wall 26. By the first side wall locking portions being locked with the lateral plate locking portions, the substrate support plate-like portion 5 is fixed at the first side wall 25 and the second side wall 26, respectively.

With the substrate support plate-like portion 5 of such a configuration, it is possible to support the edge portions of the plurality of substrates W in a state in which the adjacent substrates W among the plurality of substrates W are arranged to be spaced apart by a predetermined interval in a parallel positional relationship.

As illustrated in FIG. 2A, the back-side substrate support portion 6 includes a wall portion substrate support portion 60 and a support portion fixing member 67. The wall portion substrate support portion 60 is integrally formed with the plate portion 51 at a rear end portion of the plate portion 51 of the substrate support plate-like portion 5.

It should be noted that the back-side substrate support portion 6 may be configured so as to be separated from the substrate support plate-like portion 5. In other words, the wall portion substrate support portion 60 may be configured so as to be separated from the plate portion 51 of the substrate support plate-like portion 5.

At the support portion fixing member 67, the wall portion substrate support portions 60 are provided in a number, i.e. twenty-five, so as to respectively correspond to each one of the substrates W that can be stored in the substrate storing space 27. The wall portion substrate support portions 60 provided at the first side wall 25 and the second side wall 26 have a positional relationship that forms a pair with a front retainer 7 described later in the forward/backward direction D1. The support portion fixing member 67 has side wall rear portion locking portions (not illustrated). The side wall rear portion locking portions can be locked with back-side substrate support portion locking portions (not illustrated) respectively provided at the first side wall 25 and the second side wall 26. By the abovementioned first side wall locking portion (not illustrated) being locked with the lateral plate locking portions (not illustrated) and the side wall rear portion locking portion (not illustrated) being locked with the back-side substrate support portion locking portion (not illustrated), the substrate support plate-like portion 5 is fixed at the first side wall 25 and the second side wall 26, respectively.

As illustrated in FIG. 2B, the wall portion substrate support portion 60 includes a support portion upper portion 62 having a first contact face 621 and a support portion upper portion 63 having a second contact face 631.

As described later, when the substrate W is stored in the substrate storing space 27, and the substrate W is supported by the back-side substrate support portion 6 and the front retainer 7 by the lid body 3 being closed, an end edge of an edge portion of an upper face of the substrate W can abut the first contact face 621. When the substrate W is stored in the substrate storing space 27, and the substrate W is supported by the back-side substrate support portion 6 and the front retainer 7 by the lid body 3 being closed, an end edge of an edge portion of a lower face of the substrate W can abut the second contact face 631.

As illustrated in FIG. 3A, the lid body 3 has a substantially rectangular shape which substantially matches the shape of the opening circumferential portion 28 of the container main body 2. The lid body 3 is removably attached to the opening circumferential portion 28 of the container main body 2. By the lid body 3 being attached to the opening circumferential portion 28, the lid body 3 can close the container main body opening portion 21. As illustrated in FIG. 6, at a circumferential edge portion of the lid body 3, a sealing member fitting groove 31 is formed along the circumferential edge portion of the lid body 3. The portion of the lid body 3 in which the sealing member fitting groove 31 is formed constitutes a sealing member installation portion 311.

A ring-like sealing member 4 that may be made of elastically deformable POE (polyoxyethylene) or PEE, or alternatively made of various types of thermoplastic elastomer such as polyester and polyolefin, fluorine-containing rubber, silicon rubber, etc., is fit into the sealing member fitting groove 31 of the sealing member installation portion 311. The sealing member 4 is arranged so as to go around the circumferential edge portion of the lid body 3.

The sealing member 4 can abut the opening circumferential portion 28, which is a part of the container main body 2 that forms the container main body opening portion 21. The sealing member 4 is brought into close contact abutting with the opening circumferential portion 28 to be interposed between the opening circumferential portion 28 and the lid body 3, whereby it is possible to close the container main body opening portion 21 by the lid body 3 in an air tight state.

More specifically, when the lid body 3 is attached to the opening circumferential edge portion 28, the sealing member installation portion 311 that constitutes the circumferential edge portion of the lid body 3 abuts with an inner circumferential portion of the opening circumferential portion 28 of the container main body 2 via the sealing member 4. With such a configuration, the sealing member 4 is sandwiched to be elastically deformed between the circumferential edge portion of the lid body 3 and the inner circumferential edge portion of the opening circumferential portion 28, and thus the lid body 3 closes the container main body opening portion 21 in an air tight state. By the lid body 3 being removed from the opening circumferential portion 28, it is possible to load or unload the substrates W relative to the substrate storing space 27 in the container main body 2.

A latching mechanism is provided at the lid body 3. The latching mechanism is provided in the vicinity of both left and right end portions of the lid body 3. As illustrated in FIGS. 3A and 3B, the latching mechanism includes two upper side latch portions 32A which can project from the upper side of the lid body 3 in the upper direction D21 and two lower side latch portions (not illustrated) that can project from the lower side of the lid body 3 in the lower direction D22. The two upper side latch portions 32A are arranged in the vicinity of both left and right ends of the upper side of the lid body 3 and the two lower side latch portions are arranged in the vicinity of both left and right ends of the lower side of the lid body 3.

As illustrated in FIG. 3A, an operation portion 33 is provided at an outer face of the lid body 3. By operating the operation portion 33 from the front side of the lid body 3, it is possible to cause the upper side latch portion 32A and the lower side latch portion to project from the upper side and the lower side of the lid body 3 as well as possible to make enter a state not projecting from the upper side and the lower side of the lid body 3. By the upper side latch portion 32A projecting from the upper side of the lid body 3 in the upper direction D21 to engage with the latch engagement concave portions 231A and 231B of the container main body 2 and the lower side latch portion projecting from the lower side of the lid body 3 in the lower direction D22 to engage with the latch engagement concave portions 241A and 241B of the container main body 2, the lid body 3 is fixed to the opening circumferential portion 28 of the container main body 2.

As illustrated in FIGS. 4 to 7, a lid-body-leg portion fixing concave portion 341 that is concave forward in a direction opposite to a depth direction of the container main body 2 is formed at a part of an inner face of the lid body 3 that is a portion closing the container main body opening portion 21. The lid-body-leg portion fixing concave portion 341 has a width of approximately one third the width of the lid body 3 in the left/right direction D3 at the center location of the lid body 3 in the left/right direction D3, and is formed from the vicinity of an upper end portion up to the vicinity of a lower end portion of the lid body 3 in the upper/lower direction D2. The upper end and the lower end of the lid-body-leg portion fixing concave portion 341 is formed by the edge portion of the lid body 3. Portions that are parts of an inner face of the lid body 3 at the both sides of the lid-body-leg portion fixing concave portion 341 in the left/right direction D3 are configured by inner face left/right end portion flat faces 342.

The lid body 3 has a symmetrical configuration about a virtual line B extending vertically at the center of the lid body 3 in the left/right direction D3. For this reason, a configuration of a portion on the right side (the left side shown in FIG. 5) is mainly described in detail, and detailed explanations for a portion on the left side (the right side shown in FIG. 5) are omitted here.

Since the lid body 3 has a symmetrical configuration as described above, two front retainers 7 fixed to the lid body 3 are provided symmetrically about the virtual line B. In other words, a front retainer substrate receiving portion 73 serving as other lid body side substrate receiving portion described above is arranged so as to form a pair in the left/right direction D3, which is a direction orthogonal to a direction connecting one end portion and the other end portion of the container main body 2. A front retainer leg portion 72 connected to one front retainer substrate receiving portion 73 among the front retainer substrate receiving portions 73 forming a pair, and a front retainer leg portion 72 connected to the other front retainer substrate receiving portion 73 among the front retainer substrate receiving portions 73 forming a pair are configured separately.

As shown in FIG. 6, the portion which is a part of an inner face of the lid body 3 forming the lid-body-leg portion fixing concave portion 341 includes a bottom portion flat face 341A and step-like faces 341B. The bottom portion flat face 341A is located more in the forward direction (side in the forward direction D11) than the inner face left/right end portion flat face 342. The step-like faces 341B are arranged at both ends of the bottom portion flat face 341A in the left/right direction D3. The step-like face 341B includes a middle stage flat face 341C which is located at one stage higher than the bottom portion flat face 341A, a first step-like face 341D rising to the middle stage flat face 341C, and a second step-like face 341E rising to an inner face left/right end portion flat face 342, which is located at one further stage higher than the middle stage flat face 341C.

As illustrated in FIG. 7, portions in the vicinity of both end portions of the bottom portion flat face 341A in the left/right direction D3 each have one front retainer locking plate portion 343, which is integrally formed with the lid body 3, respectively. The vicinities of both end portions of this bottom portion flat face 341A are located at portions more in the forward direction (side in the forward direction D11) than the sealing member installation portion 311 in the backward direction D12, which is a depth direction.

The pair of the front retainer locking plate portions 343 extends in the upper/lower direction D2. A front side and a back side of one of the front retainer locking plate portions 343 are arranged in a parallel positional relationship with a front face and a back face of the other of the front retainer locking plate portions 343. As illustrated in FIG. 4, through-holes 343A that penetrate the front retainer locking plate portion 343 in the left/right direction D3 are formed in the front retainer locking plate portion 343. The 343A are formed in a positional relationship adjacent to the bottom portion flat face 341A.

Furthermore, a front retainer locking portion 344 is provided respectively at a center portion of each of the inner face left/right end portion flat faces 342 in the left/right direction D3. The center portion of this inner face left/right end portion flat face 342 is located more toward the back side (side in the backward direction D12) than the sealing member installation portion 311 in the backward direction D12 as the depth direction which is a direction from one end portion to the other end portion with respect to this one end portion of the container main body 2.

As illustrated in FIG. 7, the front retainer locking portion 344 includes a plate-like locking portion 344A and a base portion side support portion 344B. The front face and the back face of the plate-like locking portion 344A are arranged to be spaced apart from the inner face left/right end portion flat face 342 in a parallel positional relationship with the inner face left/right end portion flat faces 342. Furthermore, the longitudinal direction of the front face and the back face of the plate-like locking portion 344A is arranged in a parallel positional relationship with the upper/lower direction D2.

A left end edge of the plate-like locking portion 344A arranged on the left side (side in the left direction D31) is connected to be fixed to the base portion side support portion 344B, which is arranged to be fixed at the inner face left/right end portion flat face 342 on the left side. The base portion side support portion 344B arranged on the left side has a continuous base portion 344C, a discontinuous base portion 344D, and a connecting base portion 344E. The continuous base portion 344C extends from the vicinity of an edge portion of an upper side (side in the upper direction D21) of the lid body 3 to the vicinity of an edge portion of a lower side (side in the lower direction D22) of the lid body 3 in the upper/lower direction D2. A plurality of the discontinuous base portions 344D are provided and are shorter than the continuous base portion 344C. The discontinuous base portions 344D include longer ones and shorter ones in the longitudinal direction. The discontinuous base portions 344D extend in parallel with the continuous base portion 344C, and are arranged to be spaced apart by a predetermined interval in the upper/lower direction D2.

A plurality of the connecting base portions 344E is provided, and extends in a parallel positional relationship in the left/right direction D3. The plurality of connecting base portions 344E includes ones arranged so as to form a pair and ones arranged independently. Right ends of the connecting base portions 344E arranged to form a pair are connected to the vicinity of the upper end and the vicinity of the lower end of the longer discontinuous base portion 344D, respectively. Left ends of the connecting base portions 344E arranged to form a pair are connected to the continuous base portion 344C. A right end of the connecting base portion 344E arranged independently is connected to the shorter discontinuous base portion 344D in length and a left end of the connecting base portion 344E arranged independently is connected to the continuous base portion 344C.

As illustrated in FIGS. 4 to 6, the front retainer 7 is provided at a location opposing an inner face of the lid body 3, and extends from the front retainer locking plate portion 343 on the left side (side in the left direction D31) to the front retainer locking plate portion 344 on the left side. As illustrated in FIG. 8A, the front retainer 7 includes a pair of vertical frame bodies 71 extending in parallel in the upper/lower direction D2, a pair of front retainer leg portions 72, and a front retainer substrate receiving portion 73. The pair of vertical frame bodies 71, the front retainer leg portion 72, and the front retainer substrate receiving portion 73 are integrally formed with resin and connected to each other.

As illustrated in FIG. 6, the front retainer substrate receiving portion 73 is a part of the lid body 3 and is arranged so as to oppose a portion extending from a left end portion of the middle stage flat face 341C (end portion in the left direction D31) to a center portion between the front retainer locking portion 344 on the left side and the front retainer locking plate portion 343 on the left side in the left/right direction D3. The front retainer substrate receiving portion 73 serving as a lid body side substrate receiving portion is not arranged in the lid-body-leg portion fixing concave portion 341, but rather arranged more toward the back side (side in the backward direction D12) than the lid-body-leg portion fixing concave portion 341 in the depth direction (backward direction D12).

As illustrated in FIG. 8A, the front retainer substrate receiving portion 73 includes a receiving portion upper portion 731 having a front retainer first contact face 733 and a receiving portion lower portion 732 having a front retainer second contact face 734.

When the substrates W are supported by the back-side substrate support portion 6 and the front retainer 7 by the substrates W being stored in the substrate storing space 27 and the lid body 3 being closed, a front portion of an end edge of an edge portion of an upper face of the substrate W abuts with the front retainer first touching face 733. When the substrates W are supported by the back-side substrate support portion 6 and the front retainer 7 by the substrates W being stored in the substrate storing space 27 and the lid body 3 being closed, a front portion of an end edge of an edge portion of a lower face of the substrate W abuts with the front retainer second touching face 734. With such a configuration, the front retainer substrate receiving portion 73 can support edge portions of a plurality of the substrates W.

The left end portion, which is one end portion of the front retainer substrate receiving portion 73 (end portion in the left direction D31), is connected to the right end portion (end portion in the right direction D32) of one front retainer leg portion 721 among the pair of front retainer leg portions 72.

The right end portion, which is the other end portion of the front retainer substrate receiving portion 73, is connected to the left end portion of the other front retainer leg portion 722 among the pair of front retainer leg portions 72.

As illustrated in FIG. 6, the one front retainer leg portion 721 extends so as to approach the inner face left/right end portion flat face 342 from the left end portion of the front retainer substrate receiving portion 73, then bends at a right angle before the inner face left/right end portion flat face 342, and then extends at length in parallel with the inner face left/right end portion flat face 342 so as to approach the front retainer locking portion 344. The portion that extends at length occupies at least two-thirds of the length of the one front retainer leg portion 721. Then, the one front retainer leg portion 721 bends at a right angle so as separate from the inner face left/right end portion flat face 342 and extends slightly, then bends again at a right angle and extends slightly so as to approach the front retainer locking portion 344, and then bends again at a right angle and extends so as to approach the inner face left/right end portion flat face 342, and the left end portion of the one front retainer leg portion 72 is connected to the one vertical frame body 711.

As illustrated in FIG. 6, the other front retainer leg portion 722 extends so as to approach the middle stage flat face 341C, bends at an obtuse angle before the middle stage flat face 341C, and extends linearly up to the vicinity of the front retainer locking plate portion 343. Then, the other front retainer leg portion 722 bends at an obtuse angle, extends slightly so as to approach the bottom portion flat face 341A, and is connected to the other vertical frame body 712. The front retainer substrate receiving portion 73 and the front retainer leg portions 72 as a pair with such a configuration are provided such that twenty-five pieces thereof are arranged in parallel in the upper/lower direction D2.

As illustrated in FIG. 8A, the one vertical frame body 711 includes a first lid body locking portion 713. The first lid body locking portion 713 is an edge portion of the vertical frame body 71 in the width direction of the one vertical frame body 71 and is configured by a plate-like end portion. As illustrated in FIG. 6, by the first lid body locking portion 713 being inserted between the plate-like locking portion 344A of the front retainer locking portion 344 and the inner face left/right end portion flat face 342, the one vertical frame body 71 is locked to the front retainer locking portion 344.

Furthermore, as illustrated in FIG. 8A, a knob portion 715 which projects in a direction from the other vertical frame body 712 toward the one vertical frame body 711 is provided at the first lid body locking portion 713. By pressing the knob portion 715 to move closer to the lid body 3 and inserting into a gap between the discontinuous base portions 344D (refer to FIG. 7), the first lid body locking portion 713 can be easily inserted between the plate-like locking portion 344A of the front retainer locking portion 344 and the inner face left/right end portion flat face 342.

Furthermore, as illustrated in FIG. 8A, the other vertical frame body 712 includes a second lid body locking portion 714. The second lid body locking portion 714 is an edge portion of the vertical frame body 71 in the width direction of the other vertical frame body 71, and is configured by an end portion which particularly projects among the plate-like end portions which are formed in a wavelike manner. As illustrated in FIG. 4, the second lid body locking portion 714 is inserted into the through-hole 343A of the front retainer locking plate portion 343. With such a configuration, as illustrated in FIG. 6, the other vertical frame body 712 is locked with the front retainer locking plate portion 343.

In this way, by the one vertical frame body 711 being locked with the front retainer locking portion 344 and the other vertical frame body 712 being locked with the front retainer locking plate portion 343, the front retainer 7 is fixed to the lid body 3.

In other words, the front retainer leg portion 721 on the left side (side in the left direction D31) as the one lid body side leg portion is fixed, via the vertical frame body 711 and the front retainer locking portion 344, to a portion of the lid body 3, which is a portion more toward the back side (side in the backward direction D12) than the sealing member installation portion 311 in the backward direction D12 as the depth direction, which is a direction toward from one end portion to the other end portion with respect to the one end portion of the container main body 2, and which is a portion outside the lid-body-leg portion fixing concave portion 341.

Furthermore, the front retainer leg portion 722 on the right side (side in the right direction D32) serving as the other lid body side leg portion is fixed, via the vertical frame body 712 and the front retainer locking plate portion 343, to a portion of the lid body 3, which is a part more toward the forward direction (side in the forward direction D11) than the sealing member installation portion 311 in the backward direction D12 as the depth direction, and which is a portion inside the lid-body-leg portion fixing concave portion 341. The distance in the forward/backward direction D1 between the position at which the front retainer leg portion 721 on the left side serving as the one lid body side leg portion is fixed to the lid body 3 and the position at which the front retainer leg portion 722 on the right side serving as the other lid body side leg portion is fixed at the lid body 3 is approximately 0 mm to 50 mm. It is approximately 25 mm in the present embodiment.

In this way, since the front retainer 7 is fixed to the lid body 3 and the one front retainer leg portion 721 has the aforementioned such configuration, the lid body side substrate receiving portion (the front retainer substrate receiving portion 73) can swing with a part of the front retainer leg portion 721 serving as the one lid body side leg portion that is a portion fixed to the lid body 3, i.e. a part of the one lid body side leg portion that is a portion connected to the one vertical frame body 711, as an axial center for swinging.

By the locking of the first lid body locking portion 713 to the front retainer locking portion 344 being released and the locking of the second lid body locking portion 714 to the front retainer locking plate portion 343 being released, the front retainer 7 is removed from the lid body 3.

With the substrate storing container 1 according to the present embodiment of the abovementioned configuration, it is possible to obtain the following effects.

The lid body side substrate support portion (front retainer 7) includes the pair of lid body side leg portions (front retainer leg portions 721 and 722) and the lid body side substrate receiving portion (front retainer substrate receiving portion 73) in which one end portion thereof is connected to one lid body side leg portion and the other end portion thereof is connected to the other lid body side leg portion. The one lid body side leg portion (front retainer leg portion 721) is fixed to a part of the lid body 3 that is a portion more toward the back side (side in the backward direction D12) than the sealing member installation portion 311 in the depth direction as the depth direction which is a direction from one end portion of the container main body 2 to the other end portion with respect to the one end portion. The other lid body side leg portion (front retainer leg portion 722) is fixed to a part of the lid body 3 that is a portion more toward the forward direction (side in the forward direction D11) than the sealing member installation portion 311 in the depth direction.

More specifically, the one lid body side leg portion (the one front retainer leg portion 721) is fixed outside the lid-body-leg portion fixing concave portion 341. The other lid body side leg portion (the other front retainer leg portion 722) is fixed inside the lid-body-leg portion fixing concave portion 341.

For this reason, at parts of the lid body 3 that are portions at two points at which the distances from the center of a disk-like shape substrate stored in the substrate storing container 1 are substantially equal when the container main body opening portion 21 is closed by the lid body 3 (at a part of the inner face left/right end portion flat face 342 that is a portion at which the front retainer locking portion 344 is provided, and at a part of the bottom portion flat face 341A that is a portion at which the front retainer locking plate portion 343 is provided), one of each of the one lid body side leg portion and the other lid body side leg portion are fixed, respectively. As a result, a great difference is not allowed to arise between the elastically deformable amount at the one lid body side leg portion and the elastically deformable amount at the other lid body side leg portion, and thus it is possible to support the lid body side substrate receiving portion in a balanced manner with a preferable elasticity. Therefore, an impact received from outside of the substrate storing container 1 upon conveying the substrate storing container 1 is absorbed effectively at the lid body side substrate support portion (front retainer 7), whereby it is possible to suppress the impact from being transmitted to the substrate via the front retainer 7 as much as possible.

Furthermore, since the latching mechanisms for fixing the lid body 3 to the container main body 2 is provided at portions in the vicinity of the both ends of the lid body 3 in the left/right direction D3, the width of the lid-body-leg portion fixing concave portion 341 in the left/right direction D3 is configured so as to be relatively is short. In a case of a configuration of storing the front retainer 7 inside the lid-body-leg portion fixing concave portion 341, the width between the lid body side substrate receiving portions (front retainer substrate receiving portions 73), which are arranged as a pair, in the left/right direction D3 is inevitably made short.

Contrary to this, as described above, since the present embodiment does not have a configuration in which the front retainer 7 is stored in the lid-body-leg portion fixing concave portion 341 and the one vertical frame body 711 constituting the front retainer 7 is arranged outside the lid-body-leg portion fixing concave portion 341, it is possible to secure a wider width between the lid body side substrate receiving portions (front retainer substrate receiving portions 73). As a result, it is possible for the lid body side substrate receiving portions which are arranged as a pair (front retainer substrate receiving portion 73) to support the edge portions of the substrate W tightly and securely.

Furthermore, compared with the case in which the one lid body side leg portion (front retainer leg portion 722) is fixed to the inside of the lid-body-leg portion fixing concave portion 341, since the one lid body side leg portion (front retainer leg portion 722) is fixed to a part of the lid body 3 that is a portion more toward the back side (the side in the backward direction D12) than the sealing member installation portion 311 in the depth direction as the depth direction which is a direction from one end portion of the container main body 2 to the other end portion with respect to the one end portion, it is possible to shorten the distance from the center of the disk-like substrate W stored in the substrate storing container 1 to the portion to which the one lid body side leg portion is fixed, when the container main body opening portion 21 is closed by the lid body 3.

Therefore, it is possible to reduce deflection of the lid body side leg portion (front retainer leg portion 72) and suppress a retaining error of failing to support a substrate.

Furthermore, since the one lid body size leg portion (front retainer leg portion 721) can swing with a part of the one lid body side leg portion that is a portion fixed to the lid body 3 as an axial center for swinging, it is possible to obtain a flexible elasticity due to swinging.

Furthermore, since the lid body side substrate receiving portion (front retainer substrate receiving portion 73) is not arranged inside the lid-body-leg portion fixing concave portion 341 and is arranged more toward the back side (side in the backward direction D12) than the lid-body-leg portion fixing concave portion 341 in the depth direction (the backward direction D12), it is possible to easily support an edge portion of the substrate W by the lid body side substrate receiving portion, even in a case of storing a large substrate W having a diameter of approximately 450 mm in the substrate storing container 1, for example.

Furthermore, the lid body side substrate receiving portions (front retainer substrate receiving portions 73) are arranged to form a pair in a direction (left/right direction D3) orthogonal to a direction connecting one end portion and the other end portion of the container main body 2. Furthermore, the lid body side leg portion connected to the one lid body side substrate receiving portion (the front retainer substrate receiving portion 73 on the left side) of the lid body side substrate receiving portions forming a pair and the lid body side leg portion connected to the other lid body side substrate receiving portion (front retainer substrate receiving portion 73 on the right side) of the lid body side substrate receiving portions forming a pair are configured separately.

Therefore, it is possible to facilitate the manufacture of the lid body side substrate support portion. Furthermore, it is possible to facilitate the attachment of the lid body side substrate support portion to the lid body 3.

The present invention is not limited to the abovementioned embodiments, and modifications thereto within the technical scope claimed in the claims are possible.

For example, the shapes of the container main body and the lid body and the number and dimensions of substrates that can be stored in the container main body are not limited to the shape of the container main body 2 and the lid body 3 and the number and dimensions of the substrates W that can be stored in the container main body 2 according to the present embodiments. For example, the shape or configuration of the front retainer substrate receiving portion and the front retainer leg portion are not limited to the shape and configuration of the present embodiments.

Furthermore, although the adjacent plate portions 51 of the substrate support plate-like portion 5 are arranged in a parallel positional relationship so as to be spaced apart from each other, these may not be in a strictly parallel positional relationship, and it is acceptable so long as being juxtaposed.

EXPLANATION OF REFERENCE NUMERALS

1 substrate storing container
2 container main body
3 lid body
7 front retainer
20 wall portion
21 container main body opening portion
22 back wall
27 substrate storing space
28 opening circumferential portion
72 front retainer leg portion
73 front retainer substrate receiving portion
311 sealing member installation portion
341 lid-body-leg portion fixing concave portion
341A bottom portion flat face
342 inner face left/right end portion flat face
343 front retainer locking plate portion
344 front retainer locking portion
721 one front retainer leg portion
722 other front retainer leg portion

The invention claimed is:

1. A substrate storing container comprising:
a container main body having a substrate storing space that can store a plurality of substrates formed inside thereof, and having an opening circumferential portion at which a container main body opening portion that is in communication with the substrate storing space is formed at one end portion thereof;
a lid body that is removably attached to the opening circumferential portion and can close the container main body opening portion;
a lid body side substrate support portion which is arranged at a portion of the lid body that is a part opposing the substrate storing space when the container main body opening portion is closed by the lid body, and can support edge portions of the plurality of substrates when the container main body opening portion is closed by the lid body; and
a back-side substrate support portion that is arranged so as to form a pair with the lid body side substrate support portion inside the substrate storing space, that can support the edge portions of the plurality of substrates, and that supports the plurality of substrates in cooperation with the lid body side substrate support portion when the container main body opening portion is closed by the lid body,
wherein the lid body side substrate support portion includes a lid body side substrate receiving portion and a pair of lid body side leg portions respectively connected to one end portion and another end portion of the lid body side substrate receiving portion,
a lid-body-leg portion fixing concave portion that is concave in a direction opposite to a depth direction is formed at a part of an inner face of the lid body that is a portion which closes the container main body opening portion, and
one lid body side leg portion among the pair of lid body side leg portions is fixed outside the lid-body-leg portion fixing concave portion and the other lid body side leg portion of the pair of lid body side leg portions is fixed inside the lid-body-leg portion fixing concave portion, wherein the lid body side substrate receiving portion is configured to swing with a part of the one lid body side leg portion that is fixed to the lid body as an axial center for swinging and an inner face of the lid body has an inner face left/right end portion flat face and a portion of the one lid body side leg portion that occupies at least two-thirds of the one lid body side leg portion extends in parallel with the inner face left/right end portion flat face.

2. The substrate storing container according to claim 1, wherein
the lid body side substrate receiving portion is not arranged inside the lid-body-leg portion fixing concave portion, and is arranged more toward a back side than the lid-body-leg portion fixing concave portion in the depth direction.

3. The substrate storing container according to claim 1, wherein the lid body includes a sealing member installation portion, the substrate storing container further comprises a sealing member that is installed into the sealing member fitting portion, that can abut with the opening circumferential portion, and that closes the container main body opening portion by the lid body in an air tight state, by being interposed between the opening circumferential portion and the lid body so as to tightly abut with the opening circumferential portion, the one lid body side leg portion is fixed to a part of the lid body that is a portion more toward a back side than the sealing member installation portion in a depth direction which is a direction from one end portion of the container main body to the other end portion with respect to the one end portion, and the other lid body side leg portion is fixed to a part of the lid body that is a portion more toward a forward direction than the sealing member installation portion in the depth direction.

4. The substrate storing container according to claim 1, wherein the lid body side substrate receiving portion is arranged so as to form a pair of the lid body side substrate receiving portions in a direction orthogonal to a direction connecting one end portion and the other end portion of the container main body, and the lid body side leg portion connected to one lid body side substrate receiving portion among the lid body side substrate receiving portions forming the pair of the lid body side leg portions and the lid body side leg portion connected to another lid body side substrate receiving portion among the lid body side substrate receiving portions forming the pair are configured separately.

5. The substrate storing container according to claim 2, wherein the lid body side substrate receiving portion is arranged so as to form the pair of the lid body side substrate receiving portions in a direction orthogonal to a direction connecting one end portion and the other end portion of the container main body, and the lid body side leg portion connected to one lid body side substrate receiving portion among the lid body side substrate receiving portions forming the pair of the lid body side leg portions and the lid body side leg portion connected to another lid body side substrate receiving portion among the lid body side substrate receiving portions forming the pair are configured separately.

6. The substrate storing container according to claim 3, wherein the lid body side substrate receiving portion is arranged so as to form the pair of the lid body side substrate receiving portions in a direction orthogonal to a direction connecting one end portion and the other end portion of the container main body, and the lid body side leg portion connected to one lid body side substrate receiving portion among the lid body side substrate receiving portions forming the pair of the lid body side leg portions and the lid body side leg portion connected to another lid body side substrate receiving portion among the lid body side substrate receiving portions forming the pair are configured separately.

* * * * *